Nov. 6, 1962 C. J. SPECTOR ET AL 3,062,972

FIELD EFFECT AVALANCHE TRANSISTOR CIRCUIT
WITH SELECTIVE REVERSE BIASING MEANS

Filed Nov. 25, 1959

INVENTORS: C. J. SPECTOR
R. M. WARNER, JR.
BY H.W. Lockhart
ATTORNEY

United States Patent Office 3,062,972

Patented Nov. 6, 1962

3,062,972

FIELD EFFECT AVALANCHE TRANSISTOR CIRCUIT WITH SELECTIVE REVERSE BIASING MEANS

Clarence J. Spector, Gillette, N.J., and Raymond M. Warner, Jr., Scottsdale, Ariz., assignors to Bell Telephone Laboratories, Incorporated, New York, N.Y., a corporation of New York Filed Nov. 25, 1959, Ser. No. 855,290

7 Claims. (Cl. 307—88.5)

This invention relates to semiconductor devices and circuits including such devices. More particularly, this invention relates to circuits including semiconductor field effect devices.

The operation and theory of a field effect device are described in the Bell System Technical Journal, November 1955, at page 1149 in an article by G. C. Dacey and I. M. Ross entitled "The Field Effect Transistor."

Such a device typically comprises a semiconductor wafer the major portion of which serves as a channel of a particular conductivity-type with at least one region of the opposite conductivity-type extending therealong to provide at least one PN junction.

Two spaced ohmic contacts are attached to opposite ends of the channel and one ohmic contact is attached to the region of opposite conductivity-type. The spaced ohmic contacts define a path for the flow of majority carriers through the channel portion of the device and are referred to descriptively as the source and drain electrodes. The contacts to the opposite conductivity-type regions provide means for biasing the associated PN junctions in reverse to restrict the flow of carriers in the major portion of the device and are referred to as the gate electrodes.

The invention is based on the discovery that in a field effect transistor the relative phase between an input voltage signal and the output current waveform is related to whether the constant gate voltage is above or below the value which gives rise to avalanche breakdown of the junction associated with the gate. As is known to workers in the art, avalanche breakdown is a carrier multiplication process associated with a junction which has been biased in reverse beyond a critical value.

Utilization of this discovery in accordance with the invention is achieved in a circuit arrangement incorporating a field effect transistor in which signal information is used to selectively vary the D.C. gate voltage between values corresponding to a PN junction bias at the onset of avalanche breakdown, well below, or well above the avalanche breakdown value, whereby there is made available at the output a current waveform which has an amplitude substantially equal to zero, a current waveform of phase opposite to the input signal, or a current waveform in phase with the input signal, respectively.

One specific field effect device is the three terminal transistor described in Patent No. 2,744,970, issued May 8, 1956, to W. Shockley.

In relation to this particular device and for the purposes of this disclosure an external circuit connected between the source and drain electrodes is termed the output circuit and similarly an external circuit between the gate and source electrodes is the input circuit.

In accordance with this invention an output supply voltage source, typically a battery connected in the output circuit, initiates a flow of current internally between the source and drain of a field effect transistor as described above. A variable voltage source or, alternatively, three separate voltage sources are connected in the input circuit to provide selecting means to fix the voltage across the gate junction either at a first value representing a condition substantially into the preavalanche condition, a second value corresponding to the onset of avalanche, or a third value representing a condition substantially into the avalanche region.

The invention and the various features thereof will be understood more clearly and fully from the following detailed description with reference to the accompanying drawings, in which.

Figure 1:
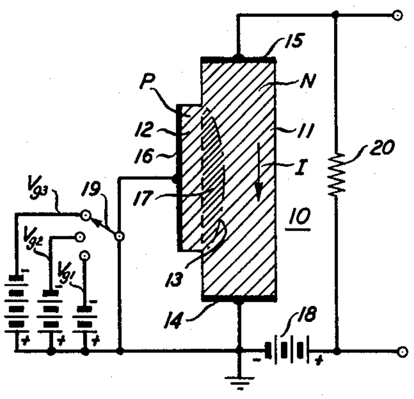
FIG. 1 is a cross-sectional view of one form of a three terminal field effect device including a diagram of the input and output D.C. circuits.

In FIG. 1, the field effect transistor 10 comprising a major portion 11 of N conductivity-type and a minor portion 12 of P conductivity-type, is typically a silicon crystal 20 mils by 20 mils by 100 mils. The two portions 11 and 12 define a rectifying PN junction 13 at their mutual interface. Ohmic contacts 14 and 15 are termed the source and drain electrodes respectively, and determine a current path through the N conductivity-type silicon crystal. Ohmic contact 16 is termed the gate electrode and is connected to the P conductivity-type portion of the crystal. A space charge region 17 is shown extending into the N-type conductivity region as a consequence of an applied reverse bias across the junction 13. Battery 18, impressing the output supply voltage, causes charge carriers to flow from electrode 14 to electrode 15 and an output current to develop across load resistance 20. Switch 19 is responsive to input information from a source not shown and selects the input D.C. voltage to be impressed. The three possible choices are designated $Vg_1$, $Vg_2$, and $Vg_3$; the larger the subscript, the larger the absolute value.

Figure 2:
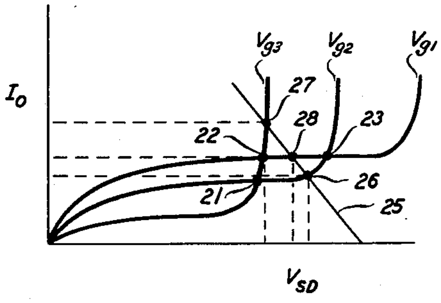
FIG. 2 is a graph depicting the output current versus source to drain voltage for several constant values of input D.C. gate voltage in the arrangement of FIG. 1.

FIG. 2 is a plot of output current versus source to drain voltage for each of the three values of input D.C. voltage. The curves are labelled in order of increasing values from $Vg_1$ to $Vg_3$. The shape of the curves can be explained as follows:

When the gate electrode of FIG. 1 is biased at $Vg_1$ corresponding to a junction condition substantially below avalanche breakdown, the output current $I_0$ will increase as the voltage between the source and the drain electrodes increases. Although there will be a voltage drop between the source and drain electrodes, the entire major portion of the device between the two electrodes will be substantially more positive than the portion of the device adjacent the gate electrode. This potential difference effectively reverse-biases the PN junction.

As the voltage applied between the source and drain increases, this reverse-bias increases, extending the associated space charge into the current path to restrict the cross-section of the current path and thereby to limit the output current. The slope of curve $Vg_1$ can be seen to decrease as the source to drain voltage increases. However, at some value of source to drain voltage the reverse-bias across the junction will correspond to avalanche breakdown. Beyond this value the output current will increase rapidly for slight further increases in source to drain voltage.

The same explanation accounts for the shape of each of the three curves but the particular source to drain voltage value for which junction breakdown occurs depends on the value of input gate voltage.

Therefore, although the shape of the curves depicted is similar, the source to drain voltage for which avalanche breakdown condition occurs will vary.

The significance of this graph is that the curves intersect each other. For example, with reference to the figure curve $Vg_1$ intersects curve $Vg_2$ at point 23 and curve $Vg_3$ at point 22, and curve $Vg_2$ intersects curve $Vg_3$ at point 21.

The utility of these intersections is made more evident if a load line 25 is superimposed on the family of curves. The three curves $Vg_1$ $Vg_2$, and $Vg_3$ intersect the load line at points 28, 26, and 27 respectively.

Observing that each point of intersection between the load line and a particular input voltage curve corresponds to a particular value of voltage between the source and drain and a particular output current, the plot can be redrawn for a fixed value of applied output supply voltage by considering the change in output current due to input D.C. voltage changes.

Figure 3:
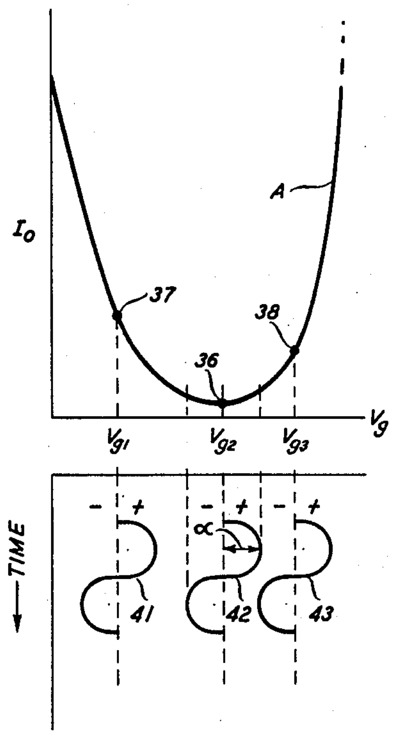
FIG. 3 is a graph depicting a plot of the output current versus input D.C. voltage for a selected constant value of output D.C. supply voltage.

In FIG. 3 curve A is a plot of the output current versus the gate control voltage for a fixed value of the output supply voltage provided by the battery 18 of FIG. 1. Thus, for a given output supply voltage and a gate control voltage $Vg_1$, the output current will have the value given by the ordinate of point 37. Similarly, the point 36 indicates a minimum output current value. This occurs at the gate voltage which is the current limiting condition just prior to avalanching. This is the value chosen for $Vg_2$. Finally, point 38 indicates an increased value of current for a gate control voltage $Vg_3$ in the avalanche condition.

An A.C. signal impressed between the source and gate electrodes is depicted as curves 41, 42, and 43 corresponding to the selected value of input gate bias. Each of these signals is a plot of voltage against time about a quiescent point corresponding, in each case, to the selected value of input gate control voltage. With the quiescent point at $Vg_1$ the output or source to drain current is decreasing as the input signal 41 is increasing. With the quiescent point at $Vg_2$, the output current is negligible for small amplitude variations of the A.C. signal applied to the gate. With the quiescent point at $Vg_3$, the output current increases as the input voltage signal increases. Therefore, three different kinds of output current are obtainable in response to an input A.C. voltage signal, depending on the slope of the curve corresponding to the selected value of the gate control voltage.

Figure 4:
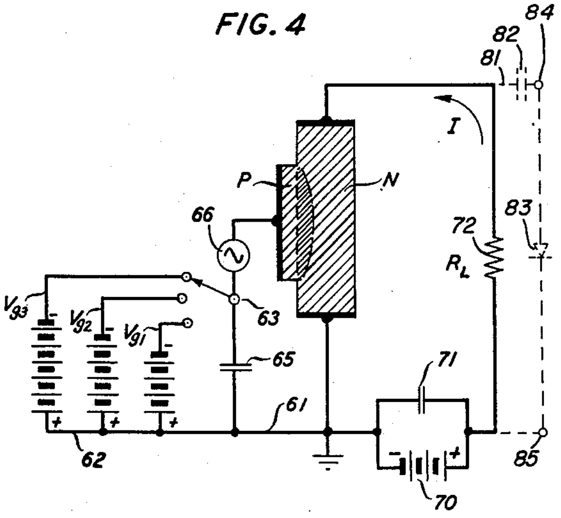
FIG. 4 is a three-state logic circuit, the mode of operation of which depends on the characteristic shown in in FIG. 3.

FIG. 4 depicts one circuit configuration which produces the unique response described in relation to FIG. 3. A plot of the output current versus gate control voltage will be substantially the same as depicted in FIG. 3.

The circuit includes all the elements of FIG. 1 with additional elements as noted below. The input circuit 61 is connected from the source electrode which is at ground potential to the gate electrode of device 10 of FIG. 1, and consists essentially of a gate control source 62 which at any given instant will have value $Vg_1$, $Vg_2$, or $Vg_3$, depending on the position of switch 63, a shunt capacitor 65 which provides an A.C. by-pass and an input signal source 66 in series with the shunted gate control source. The switch 63 is responsive to a voltage selecting means not shown. Typically the switch 63 will be electronic rather than mechanical in nature and will be switched by input control information.

The output circuit is connected from the source electrode, which is at ground potential, to the drain electrode and consists essentially of a D.C. source 70 shunted by a capacitor 71 and in series with the load resistance 72. The D.C. source is a battery which provides the current flowing initially from the source to drain electrodes as described in relation to FIG. 1.

An arrangement as described is particularly useful as a three-state logic circuit providing a negative, positive, or essentially zero current output in response to an A.C.

signal input, depending on the particular value of gate control voltage applied.

The arrangement has additional encoding utility. For example, by providing an A.C. path 81 by the insertion of capacitor 82 in the output circuit and a diode 83 in path 81 to clip off the positive portion of the output current waveform observed between output terminals 84 and 85, only one familiar with the schedule of gate voltage values would be able to reconstruct the input signal.

For an A.C. circuit arrangement with a load resistance as described in FIG. 4 the output current values corresponding to the various gate or input D.C. voltages at a constant output supply voltage are determined by drawing a load line through the curves of constant gate voltage drawn on an output current versus source to drain voltage graph. The points of intersection of the load line and the several curves correspond to the output current for each gate voltage value.

Advantageously, the load line is drawn through a first constant gate voltage curve at the points on this curve approximately corresponding to the onset of avalanche breakdown. The load line will intersect various points along curves plotted for other constant values of gate voltage.

One representation of the position of the load line is shown in FIG. 2. However, both the slope and the position of the load line vary depending on the load resistance and the point of intersection between the load line and the first constant gate voltage curve above. This variation is limited because, for advantageous operation, the load line intersects each curve only once and in a particular voltage range. For example, with reference to FIG. 2, the load line varies such that point 28 always lies between points 22 and 23.

In one specific embodiment of this invention a germanium field effect transistor 20 mils by 20 mils by 100 mils having an N conductivity-type channel and a P-type diffused gate region was fabricated by diffusing gallium into an N-type germanium crystal in accordance with the solid state diffusion techniques described in Patent No. 2,861,018, issued November 18, 1958, to C. S. Fuller and M. Tannenbaum. Gold-antimony ohmic contacts were affixed to the ends of the N-region and a gold-gallium contact was affixed to the center of the P-region in accordance with the thermocompression bonding technique described in the copending application Serial No. 619,639 of O. L. Anderson and H. Christensen assigned to the assignee of the present application. The zero gate bias avalanche breakdown occurred at a source to drain voltage of 9 volts. A 9 volt battery shunted by a 25 microfarad capacitor was connected in series with a 15,000 ohm load resistor and this combination connected between source and drain to form the output circuit. The input circuit comprising an input terminal for impressing positive one-volt pulses and a switchable D.C. gate bias selector was connected between gate and source. When a series of identical positive one-volt pulses was applied to the input terminal, output pulses were observed which were positive, negative or negligibly small depending on the level of D.C. gate bias, for example −3 volts or −1 volt or −2 volts.

The field effect device in accordance with this invention need not necesarily be the three terminal avalanche transistor described in relation to FIG. 1. The two junction, two gate electrode field effect transistor described in the Bell System Technical Journal referred to above with minor circuit changes to include both the gate electrodes in the input circuit can also be employed.

Moreover, the field effect device need only have the transfer or output current versus gate voltage characteristic described in relation to FIG. 3, the basis of operation of the invention being the use of the change in the output current represented by the particular shape of this curve.

Specifically, in the aspect of this invention pertaining to operation as a three-state logic network, use is made of the difference betwen the character of the output current in three different portions of the curve, the preavalanche, the onset of avalanche and the avalanche portions.

No effort has been made to describe all possible embodiments of the invention. It should be understood the various aspects and embodiments described are merely illustrative of the various forms of the invention and various modifications may be made therein without departing from the scope and spirit of this invention.

For example, alternative circuitry may be devised to eliminate the use of capacitors as described in relation to FIG. 4. One such alternative circuit would provide separate means of impressing an A.C. signal across the gate. Therefore, the circuitry shown is merely an illustration of an embodiment of the invention.

Also, gate bias variations may be used advantageously to vary the impedance to an A.C. signal impressed in the source-drain circuit to provide an A.C. switch.

What is claimed is:

1. In combination, a semiconductor element including a semiconductor wafer having an extended channel portion of one conductivity-type and a gate portion of the opposite conductivity-type forming a rectifying junction therebetween, a first and second space ohmic contact connected to said channel portion, a third ohmic contact connected to said gate portion, an input circuit connected between said first and third contacts, the circuit including means supplying a unidirectional voltage of polarity to bias said rectifying junction in reverse and means supplying an alternating voltage, an output circuit connected between said first and second contacts including voltage means supplying a unidirectional voltage and a load, said semiconductor element being charactized by an output current versus input voltage curve which includes at least one minimum thereby dividing said curve into at least three portions, one portion having a negative slope, one portion having a slope effectively equal to zero, and the third portion having a positive slope, means for selecting one predetermined input voltage value corresponding to each portion of said curve betwen said rectifying contact and one of said two space ohmic contacts, and a utilization circuit connected between said two spaced ohmic contacts.

2. A combination, in accordance with claim 1 wherein said semiconductor device comprises a three terminal field effect transistor.

3. In combination, an electric device comprising a semiconductor body of uniform conductivity-type provided with spaced substantially ohmic contacts and at least one rectifying contact adapted to decrease the current flow between said space ohmic contacts, means for selectively reverse-biasing said rectifying contact substantially in the pre-avalanche condition, at the onset of avalanche condition, and substantially in the valanche condtion, means for superimposing an alternating current signal on said bias, and a utilization circuit connected between said ohmic contacts.

4. In combination, a field effect avalanche transistor having therein at least one PN junction and at least one gate electrode, a source and a drain electrode, means for impressing an alternating current signal between said gate and source electrodes, means for impressing selectively one of three values of D.C. bias between said gate and drain electrode, the highest value corresponding to biasing the PN junction significantly into the avalanche breakdown region, the middle value corresponding to biasing the PN junction at the onset of avalanche breakdown, the third value corresponding to biasing the PN junction significantly below avalanche breakdown, and a utilization means connecting said source and drain electrodes.

5. A combination, in accordance with claim 4 wherein said utilization circuit comprises a load resistance connected in series with a battery shunted by a capacitor.

6. In combination, a field effect avalanche transistor having therein at least one PN junction and at least one gate electrode, a source and drain electrode, means for impressing a bias voltage between said gate and source electrode corresponding to reverse-biasing the PN junction substantially into the pre-avalanche region, means for impressing a signal voltage between said gate and source electrodes, said signal voltage having an amplitude sufficient to provide a voltage in at least one portion of the positive cycle corresponding to biasing the PN junction substantially into the avalanche region, a battery shunted by a capacitor connected between the source and drain electrodes, a load resistance in series with said shunted battery, two output terminals separated from said drain electrode by a capacitor, and an asymmetrically conducting device connected between said two output terminals.

7. In combination, a field effect avalanche transistor having therein a PN junction and a gate, a source and a drain electrode and having a zero gate bias avalanche breakdown occurring at 9 volts source to drain, means for selectively impressing a bias voltage of 1 volt, 2 volt, and 3 volt, means for superimposing a pulse of 1 volt amplitude, a battery of 9 volts shunted by a capacitor of 25 microfarads and a load resistance of 15,000 ohms connected in series with said shunted battery between said sources and drain electrodes.

References Cited in the file of this patent

UNITED STATES PATENTS

| | | |
|---|---|---|
| 2,591,961 | Moore et al. | Apr. 8, 1952 |
| 2,744,970 | Shockley | May 8, 1956 |

OTHER REFERENCES

Hunter: "Handbook of Semiconductor Electronics," McGraw-Hill Book Co., New York, Oct. 15, 1956, pages 4–33.

Shea: "Circuit Engineering," John Wiley and Sons, New York, copyright 1957, page 250.